United States Patent
He et al.

(10) Patent No.: US 11,841,405 B2
(45) Date of Patent: Dec. 12, 2023

(54) SUPERCONDUCTING MAGNET FOR MRI SYSTEM, AND PROCESSING TOOL AND PROCESSING METHOD THEREFOR

(71) Applicant: Siemens Healthcare Limited, Camberley (GB)

(72) Inventors: Jianping He, Shenzhen (CN); Bin He, Shenzhen (CN); Yu Xin Nie, Shenzhen (CN); Kui Xiang Gu, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/849,045

(22) Filed: Jun. 24, 2022

(65) Prior Publication Data
US 2022/0413069 A1 Dec. 29, 2022

(30) Foreign Application Priority Data
Jun. 29, 2021 (CN) .......................... 202110729696.1

(51) Int. Cl.
*G01R 33/34* (2006.01)
*G01R 33/48* (2006.01)
*G01R 33/38* (2006.01)

(52) U.S. Cl.
CPC .......... *G01R 33/34* (2013.01); *G01R 33/3802* (2013.01); *G01R 33/48* (2013.01)

(58) Field of Classification Search
CPC .......................... G01R 33/421; G01R 33/3802
See application file for complete search history.

(56) References Cited

U.S. PATENT DOCUMENTS

| 5,237,300 | A | * | 8/1993 | Ige | G01R 33/3815 324/319 |
| 5,668,516 | A | * | 9/1997 | Xu | G01R 33/421 324/318 |
| 7,849,587 | B2 | * | 12/2010 | Calvert | G01R 33/3802 438/57 |
| 8,305,173 | B2 | * | 11/2012 | Tamura | G01R 33/3815 324/318 |
| 8,943,676 | B2 | * | 2/2015 | Hutton | G01R 33/3802 427/124 |

(Continued)

FOREIGN PATENT DOCUMENTS

WO WO-2013102509 A1 * 7/2013 ......... G01R 33/3802

*Primary Examiner* — Steven L Yeninas
(74) *Attorney, Agent, or Firm* — Banner & Witcoff Ltd.

(57) ABSTRACT

A processing tool for a superconducting magnet of an MRI system is disclosed. The processing tool comprising a first winding part and a second winding part. The first winding part is used as a winding framework for winding a main coil half-body. The second winding part is used as a winding framework for winding a shield coil. The processing tool has an infusion cavity. The infusion cavity comprises a main coil accommodating zone, a shield coil accommodating zone, and a linking zone. The main coil accommodating zone is used for accommodating the main coil half-body wound on the first winding part. The shield coil accommodating zone is used for accommodating the shield coil wound on the second winding part. The main coil accommodating zone is connected to the shield coil accommodating zone via the linking zone. The processing tool helps to reduce the difficulty of superconducting magnet processing.

17 Claims, 11 Drawing Sheets

(56) References Cited

U.S. PATENT DOCUMENTS

| | | | | |
|---|---|---|---|---|
| 2006/0218942 A1* | 10/2006 | Atkins | ............... | G01R 33/3815 |
| | | | | 62/51.1 |
| 2014/0274722 A1* | 9/2014 | Calvert | .................... | H01F 6/06 |
| | | | | 335/216 |
| 2017/0097397 A1* | 4/2017 | Jonas | ................. | G01R 33/3815 |
| 2017/0248667 A1* | 8/2017 | Calvert | ............. | G01R 33/3815 |
| 2021/0358667 A1* | 11/2021 | Down | ................ | G01R 33/3802 |
| 2022/0326325 A1* | 10/2022 | Calvert | ............. | G01R 33/3804 |

* cited by examiner

SUPERCONDUCTING MAGNET FOR MRI SYSTEM, AND PROCESSING TOOL AND PROCESSING METHOD THEREFOR

CROSS-REFERENCE TO RELATED APPLICATIONS

The present application claims the benefit of the filing date of China patent application no. CN 202110729696.1, filed on Jun. 29, 2021, the contents of which are incorporated herein by reference in their entirety.

TECHNICAL FIELD

The present disclosure relates to a processing tool, and in particular, to a processing tool for processing a superconducting magnet of an MRI system, as well as a processing method that uses the processing tool, and a superconducting magnet formed by processing by the processing method.

BACKGROUND

The superconducting magnet of an MRI system often comprises a main coil and a shield coil arranged around the main coil. The main coil is used to form an imaging magnetic field. The main coil and the shielding coil maintain a certain distance from each other and are connected by a connection structure. Existing connection structures are complex, and are difficult to process and assemble.

SUMMARY

An objective of the present disclosure is to provide a processing tool for a superconducting magnet of an MRI system, which helps to reduce the difficulty involved in processing the superconducting magnet.

Another objective of the present disclosure is to provide a processing method for a superconducting magnet of an MRI system, which helps to reduce the difficulty involved in processing the superconducting magnet.

Another objective of the present disclosure is to provide a superconducting magnet for an MRI system that is easy to process.

The present disclosure provides a processing tool for a superconducting magnet of an MRI system. The processing tool comprises a first winding part and a second winding part. The first winding part is used as a winding framework for winding a main coil half-body of the superconducting magnet. The second winding part is used as a winding framework for winding a shield coil of the superconducting magnet. The processing tool has an infusion cavity. The infusion cavity comprises a main coil accommodating zone, a shield coil accommodating zone, and a linking zone. The main coil accommodating zone is used for accommodating the main coil half-body of the superconducting magnet wound on the first winding part. The shield coil accommodating zone is used for accommodating the shield coil of the superconducting magnet wound on the second winding part. The main coil accommodating zone is connected to the shield coil accommodating zone via the linking zone.

Using the processing tool for a superconducting magnet of an MRI system helps to reduce the difficulty of processing of the superconducting magnet.

In another embodiment of the processing tool for a superconducting magnet of an MRI system, the main coil accommodating zone is circularly tubular, and the shield coil accommodating zone is circularly annular. The shield coil accommodating zone is coaxially arranged around the main coil accommodating zone. This helps to improve the stability of the superconducting magnet.

In another embodiment of the processing tool for a superconducting magnet of an MRI system, the linking zone is annular, with an inner edge thereof being connected to the main coil accommodating zone, and an outer edge thereof being connected to the shield coil accommodating zone. This helps to improve the structural stability of the superconducting magnet.

In another embodiment of the processing tool for a superconducting magnet of an MRI system, the linking zone takes the form of an annular plate extending along a side face of a conical frustum, wherein an axis of the side face of the conical frustum overlaps an axis of the main coil accommodating zone. This helps to improve the structural stability of the superconducting magnet.

In another embodiment of the processing tool for a superconducting magnet of an MRI system, the linking zone comprises multiple separate linking subzones. Each linking subzone takes the form of a strip extending along a straight line. One end of each linking subzone is connected to the main coil accommodating zone, and the other end of each linking subzone being connected to the shield coil accommodating zone. The multiple linking subzones are distributed uniformly in the circumferential direction of the main coil accommodating zone. This reduces the material cost of the superconducting magnet as well as the weight of the superconducting magnet.

In another embodiment of the processing tool for a superconducting magnet of an MRI system, each linking subzone takes the form of a strip extending along a generatrix of a conical frustum, wherein an axis of the conical frustum overlaps an axis of the main coil accommodating zone. This helps to improve the structural stability of the superconducting magnet.

In another embodiment of the processing tool for a superconducting magnet of an MRI system, a height direction of the processing tool is parallel to the axial direction of the superconducting magnet formed by processing with the processing tool. The infusion cavity further comprises multiple extension zones. Each extension zone takes the form of a rod extending in the height direction. One end of each extension zone is connected to the linking zone, and the other end of each extension zone is closed. This helps to improve the structural stability of the superconducting magnet.

In another embodiment of the processing tool for a superconducting magnet of an MRI system, a height direction of the processing tool is parallel to the axial direction of the superconducting magnet formed by processing with the processing tool. The processing tool comprises a first assembly member, a second assembly member and a third assembly member, which can be separated from one another in the height direction. The first assembly member is provided with the first winding part. The first winding part has a first outer cylindrical face for winding the main coil half-body of the superconducting magnet. An axis of the first outer cylindrical face is parallel to the height direction. The second assembly member is provided with the second winding part. The second winding part has a second outer cylindrical face for winding the shield coil of the superconducting magnet. The second outer cylindrical face is coaxially arranged around the first outer cylindrical face.

The second assembly member also has a first inner cylindrical face and a first annular connecting face. The first inner cylindrical face is arranged coaxially with the first outer cylindrical face and located between the first outer cylindrical face and the second outer cylindrical face. An outer edge of the first annular connecting face is connected to the second outer cylindrical face, and an inner edge of the first annular connecting face is connected to the first inner cylindrical face. The third assembly member has a second inner cylindrical face, a third inner cylindrical face and a second annular connecting face. The second inner cylindrical face has the same diameter as the first inner cylindrical face and is coaxially arranged at one side in the axial direction of the first inner cylindrical face. The first outer cylindrical face, the first inner cylindrical face, and the second inner cylindrical face are used to enclose the main coil accommodating zone. The third inner cylindrical face is coaxially arranged around the second outer cylindrical face. The second outer cylindrical face and the third inner cylindrical face are used to enclose the shield coil accommodating zone. An outer edge of the second annular connecting face is connected to the third inner cylindrical face, and an inner edge of the second annular connecting face is connected to the second inner cylindrical face. The second annular connecting face and the first annular connecting face are arranged opposite each other in the height direction, in order to enclose the linking zone. This structure is simple and facilitates operations.

The present disclosure also provides a processing method for a superconducting magnet of an MRI system, wherein the processing method uses the processing tool described above. The processing method comprises: winding a main coil half-body of the superconducting magnet, using the first winding part as a winding framework; winding a shield coil of the superconducting magnet, using the second winding part as a winding framework; infusing an infusion material into the infusion cavity and curing the infusion material; and removing the processing tool. The processing method helps to reduce the difficulty of processing of the superconducting magnet.

In another embodiment of the processing method for a superconducting magnet of an MRI system, the respective quantities of the first winding part, the second winding part, the main coil accommodating zone, the shield coil accommodating zone, and the linking zone of the processing tool are all one. A superconducting magnet half-body is formed after the processing tool is removed in the processing method. The processing method further comprises connecting two superconducting magnet half-bodies to form the superconducting magnet after removing the processing tool. This helps to reduce the cost of the processing tool.

In another embodiment of the processing method for a superconducting magnet of an MRI system, a height direction of the processing tool is parallel to the axial direction of the superconducting magnet formed by processing with the processing tool. The infusion cavity further comprises multiple extension zones, each extension zone taking the form of a rod extending in the height direction. One end of each extension zone is connected to the linking zone, and the other end of each extension zone is closed. After the infusion material is infused into the infusion cavity and cured in the processing method, a rod part formed by curing of the infusion material is formed in each extension zone, and a main coil infusion half-body formed by curing of the infusion material is formed in the main coil accommodating zone. The step of connecting two superconducting magnet half-bodies to form the superconducting magnet comprises: connecting the main coil infusion half-bodies of the two superconducting magnet half-bodies, and connecting free ends of the rod parts of the two superconducting magnet half-bodies. This helps to improve the structural stability of the superconducting magnet.

In another embodiment of the processing method for a superconducting magnet of an MRI system, the processing method further comprises: laying a reinforcing core material before infusing the infusion material into the infusion cavity, such that the reinforcing core material is ultimately located in the infusion cavity. This helps to improve the structural stability of the superconducting magnet.

In another embodiment of the processing method for a superconducting magnet of an MRI system, the infusion material is a resin, and the reinforcing core material is a glass fiber material. This helps to improve the structural stability of the superconducting magnet.

In another embodiment of the processing method for a superconducting magnet of an MRI system, the processing method comprises: winding a main coil half-body of the superconducting magnet, using the first winding part as a winding framework; winding a shield coil of the superconducting magnet, using the second winding part as a winding framework; assembling the first assembly member, the second assembly member and the third assembly member, to form the infusion cavity; infusing an infusion material into the infusion cavity and curing the infusion material; and removing the processing tool. This makes the processing operations more convenient.

The present disclosure also provides a superconducting magnet for an MRI system, the superconducting magnet being formed by processing by the processing method described above, and comprising a main coil, two shield coils, and an infusion main body formed by curing of a liquid. The two shield coils are arranged at two ends in the axial direction of the main coil respectively in an encircling manner. The infusion main body comprises a first molded part, two second molded parts, and two connecting parts. The first molded part is joined to the main coil by impregnation and curing. Each second molded part is joined to one shield coil by impregnation and curing. Each connecting part connects the first molded part to one second molded part. The superconducting magnet has good structural stability and is easy to process.

In another embodiment of the superconducting magnet for an MRI system, the superconducting magnet comprises a main coil, two shield coils, and an infusion main body formed by curing of a liquid. The two shield coils are arranged at two ends in the axial direction of the main coil respectively in an encircling manner. The infusion main body comprises a first molded part, two second molded parts, two connecting parts, and a set of reinforcing parts. The first molded part is joined to the main coil by impregnation and curing. Each second molded part is joined to one shield coil by impregnation and curing. Each connecting part connects the first molded part to one second molded part. Each reinforcing part takes the form of a rod extending in the axial direction of the main coil, with two ends of each reinforcing part being connected to the two connecting parts respectively. This helps to improve the structural stability of the superconducting magnet.

In another embodiment of the superconducting magnet for an MRI system, a reinforcing core material is embedded in the infusion main body. This helps to improve the structural stability of the superconducting magnet.

BRIEF DESCRIPTION OF THE DRAWINGS/FIGURES

The following drawings merely illustrate and explain the present disclosure schematically, without limiting the scope thereof.

Figure 1:
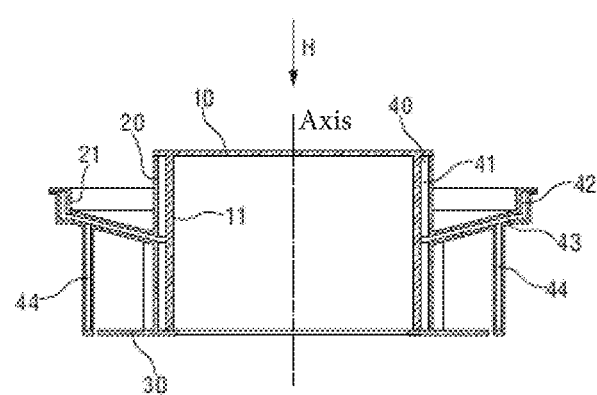
FIG. 1 is a sectional view of an example processing tool for a superconducting magnet of an MRI system, in accordance with an embodiment of the present disclosure.

KEY TO LABELS 10 first assembly member
11 first winding part
20 second assembly member
21 second winding part
22 groove
30 third assembly member
40 infusion cavity
41 main coil accommodating zone
42 shield coil accommodating zone
43 linking zone
44 extension zone
W1 first outer cylindrical face
W2 second outer cylindrical face
N1 first inner cylindrical face
N2 second inner cylindrical face
N3 third inner cylindrical face
H1 first annular connecting face
H2 second annular connecting face
60 main coil
61 main coil half-body
70 shield coil
80 infusion main body
81 first molded part
82 second molded part
83 connecting part
831 connecting subpart
84 reinforcing part
90 reinforcing core material
100 superconducting magnet
101 superconducting magnet half-body
102 main coil infusion half-body
103 rod part
H height direction.

DETAILED DESCRIPTION

To enable a clearer understanding of the technical features, objectives and effects of the present disclosure, particular embodiments of the present disclosure are now described with reference to the drawings, in which identical labels represent structurally identical or structurally similar but functionally identical components.

To keep the drawings uncluttered, only parts relevant to the present disclosure are shown schematically in each drawing, and these do not represent the actual structure thereof as a product.

Figure 2:
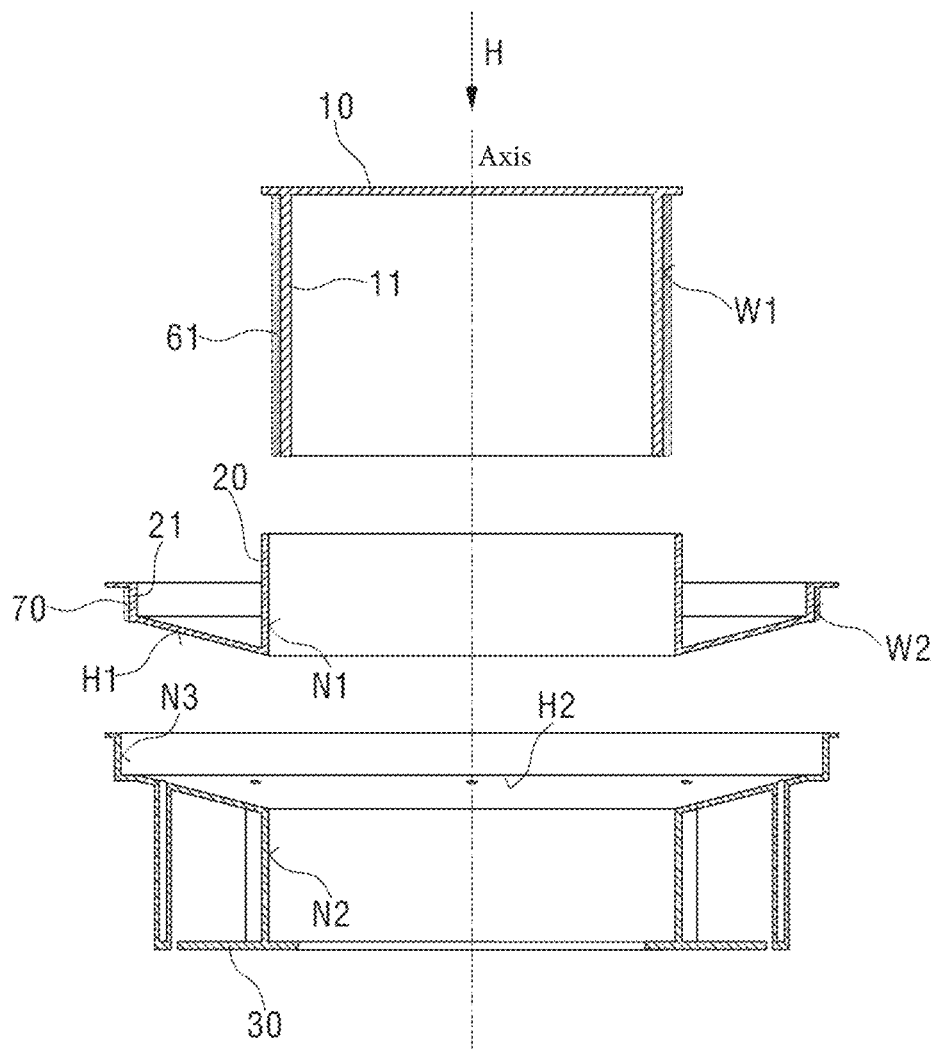
FIG. 2 is an exploded drawing of the processing tool shown in FIG. 1, in accordance with an embodiment of the present disclosure.

FIG. 1 is a sectional view of an example processing tool for a superconducting magnet of an MRI system, in accordance with an embodiment of the present disclosure. FIG. 2 is an exploded drawing of the processing tool shown in FIG. 1, in accordance with an embodiment of the present disclosure. As shown in FIGS. 1 and 2, the processing tool for a superconducting magnet of an MRI system comprises a first assembly member 10, a second assembly member 20, and a third assembly member 30, which can be separated from one another in a height direction H. The height direction H of the processing tool is parallel to the axial direction of the superconducting magnet formed by processing with the processing tool.

The first assembly member 10 is provided with a first winding part 11. The first winding part 11 is used as a winding framework for winding a main coil half-body of the superconducting magnet. FIG. 2 shows schematically a main coil half-body 61 of the superconducting magnet wound on the first winding part 11. In this embodiment, a main coil of the superconducting magnet is formed of two main coil half-bodies arranged in the axial direction thereof. In this embodiment, the first winding part 11 has a first outer cylindrical face W1 for winding a main coil half-body of the superconducting magnet; an axis of the first outer cylindrical face W1 is parallel to the height direction H.

The second assembly member 20 is provided with a second winding part 21. The second winding part 21 is used as a winding framework for winding a shield coil of the superconducting magnet. FIG. 2 shows schematically a shield coil 70 of the superconducting magnet wound on the second winding part 21. In this embodiment, the second winding part 21 has a second outer cylindrical face W2 for winding a shield coil of the superconducting magnet. The second outer cylindrical face W2 is arranged around the first outer cylindrical face W1 coaxially.

As shown in FIG. 1, the first assembly member 10, second assembly member 20 and third assembly member 30 enclose an infusion cavity 40. The infusion cavity 40 comprises a main coil accommodating zone 41, a shield coil accommodating zone 42, a linking zone 43 and multiple extension zones 44 (only two of which can be seen in FIG. 1). The main coil accommodating zone 41 is used to accommodate the main coil half-body of the superconducting magnet wound on the first winding part 11. The shield coil accommodating zone 42 is used to accommodate the shield coil of the superconducting magnet wound on the second winding part 21. The main coil accommodating zone 41 is connected to the shield coil accommodating zone 42 via the linking zone 43.

In this embodiment, the main coil accommodating zone 41 is circularly tubular (in this text, circularly tubular means in the form of a straight tube with a round cross section), and an axis thereof overlaps the axis of the first outer cylindrical face W1. To achieve this, the second assembly member 20 also has a first inner cylindrical face N1, the first inner cylindrical face N1 being arranged coaxially with the first outer cylindrical face W1 and located between the first outer cylindrical face W1 and the second outer cylindrical face W2. The third assembly member 30 has a second inner cylindrical face N2, the second inner cylindrical face N2 having the same diameter as the first inner cylindrical face N1 and being coaxially arranged at one side in the axial direction of the first inner cylindrical face N1. The first outer cylindrical face W1, the first inner cylindrical face N1, and the second inner cylindrical face N2 are used to enclose the main coil accommodating zone 41.

In this schematic embodiment, the shield coil accommodating zone 42 is circularly annular. The shield coil accommodating zone 42 is coaxially arranged around the main coil accommodating zone 41. To achieve this, the third assembly member 30 also has a third inner cylindrical face N3, the third inner cylindrical face N3 being coaxially arranged around the second outer cylindrical face W2. The second outer cylindrical face W2 and third inner cylindrical face N3 are used to enclose the shield coil accommodating zone 42.

In this embodiment, the linking zone 43 takes the form of an annular plate extending along a side face of a conical frustum, with an inner edge thereof being connected to the main coil accommodating zone 41 and an outer edge thereof being connected to the shield coil accommodating zone 42. An axis of the side face of the conical frustum overlaps the axis of the main coil accommodating zone 41. To achieve this, the second assembly member 20 also has a first annular connecting face H1, with an outer edge of the first annular connecting face H1 being connected to the second outer cylindrical face W2, and an inner edge of the first annular connecting face H1 being connected to the first inner cylindrical face N1. The third assembly member 30 has a second annular connecting face H2. An outer edge of the second annular connecting face H2 is connected to the third inner cylindrical face N3, and an inner edge of the second annular connecting face H2 is connected to the second inner cylindrical face N2. The second annular connecting face H2 and first annular connecting face H1 are both conical frustum side faces, and are arranged opposite each other in the height direction H, to enclose the linking zone 43. However, this is provided by way of example and not limitation; in other schematic embodiments, the linking zone 43 may also be another form of ring shape, e.g. a ring shape that is spread out along a plane.

As shown in FIG. 1, each extension zone 44 takes the form of a rod extending in the height direction H. One end of each extension zone 44 is connected to the linking zone 43, and the other end of each extension zone 44 is closed. In this schematic embodiment, there are 8 extension zones 44 distributed uniformly around the axis of the main coil accommodating zone 41, but this is provided by way of example and not limitation; in other schematic embodiments, the number of extension zones 44 and the way in which they are arranged may be adjusted as required, or no extension zones 44 may be provided.

Figure 3:
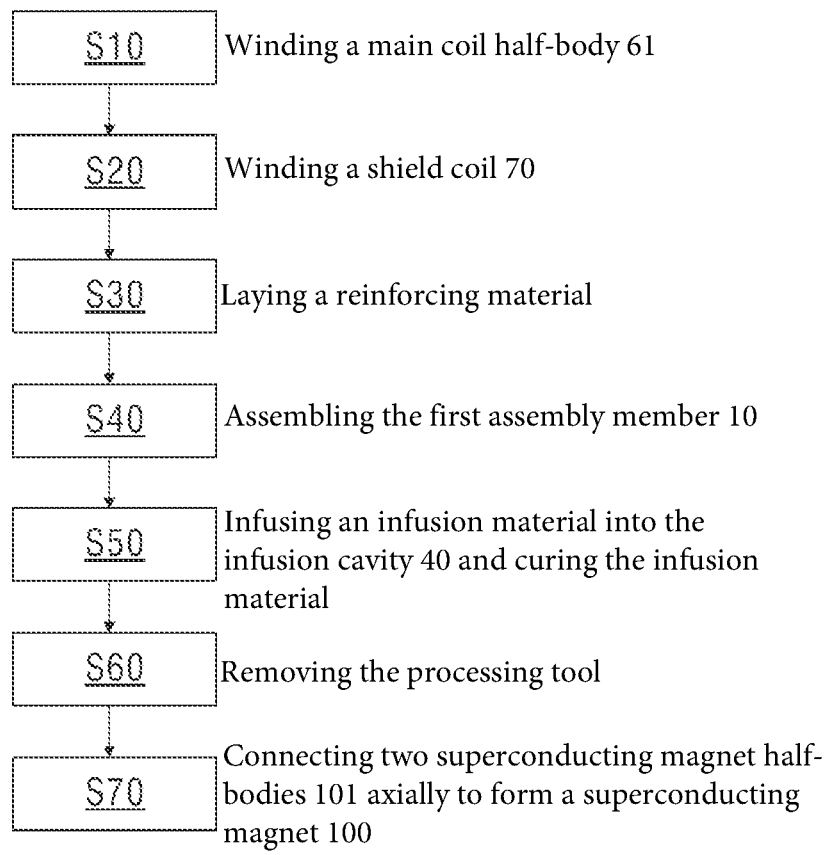
FIG. 3 is a flow chart of an example processing method for a superconducting magnet of an MRI system, in accordance with an embodiment of the present disclosure.
Figure 4:
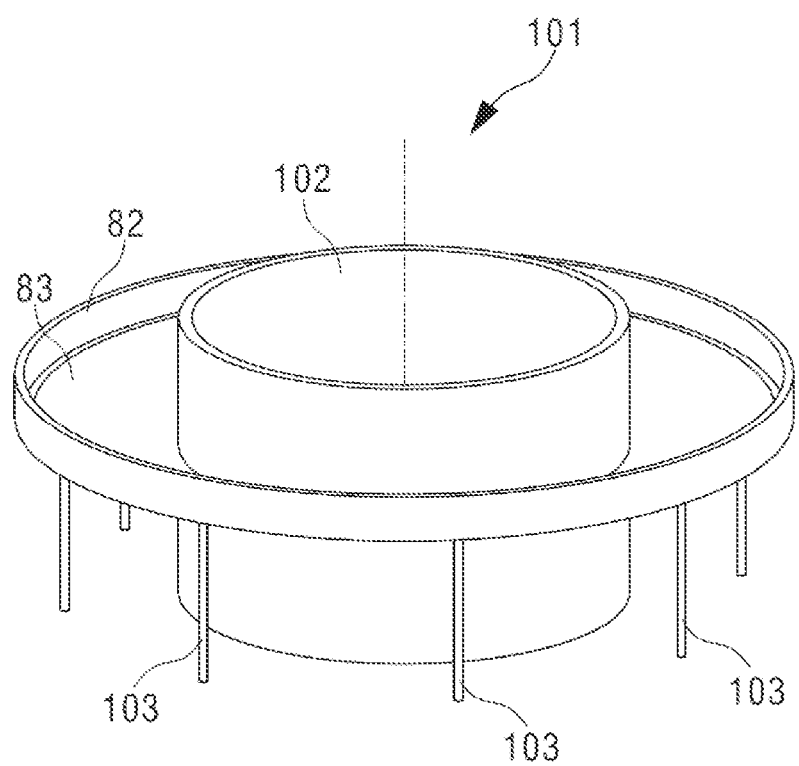
FIG. 4 is a structural schematic drawing of an example superconducting magnet half-body formed by processing with the processing tool shown in FIG. 1.
Figure 5:
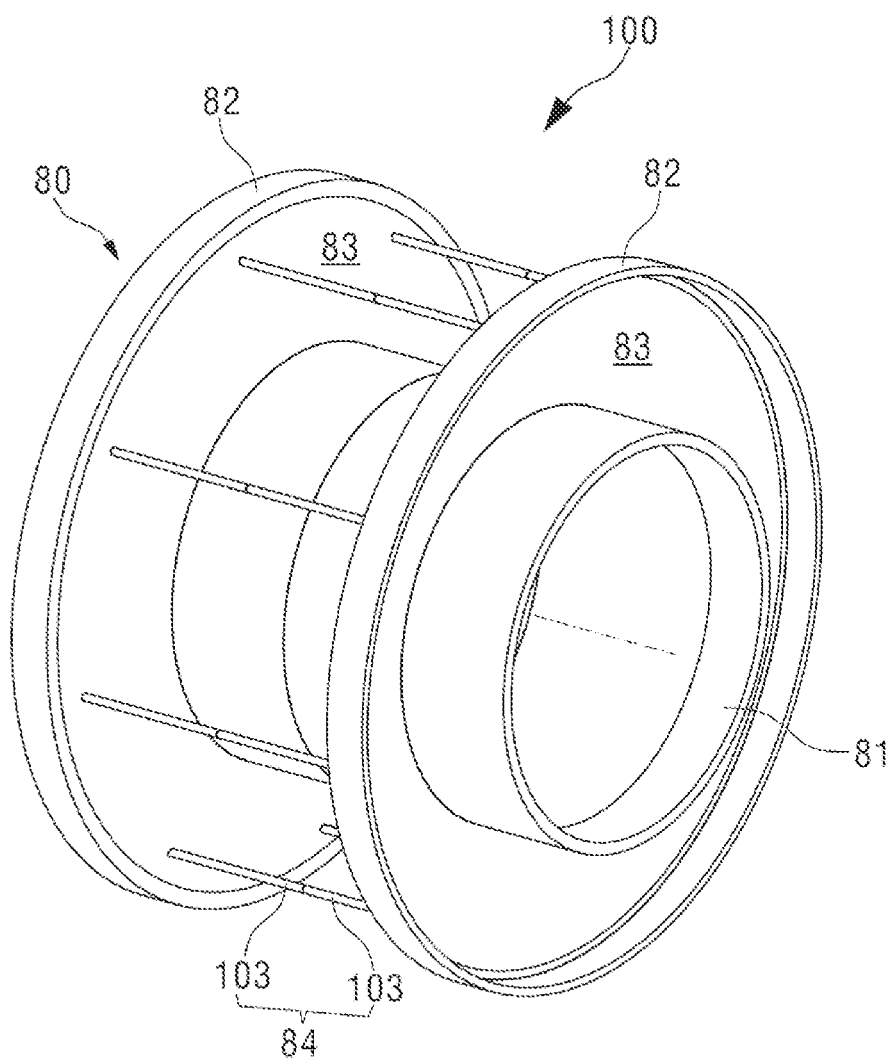
FIG. 5 is a structural schematic drawing of an example superconducting magnet formed from the superconducting magnet half-body shown in FIG. 4.

The following is an embodiment of a processing method for a superconducting magnet of an MRI system that uses the processing tool; as shown in FIG. 3, the method comprises the following steps S10 to S70:

S10: winding a main coil half-body 61 of a superconducting magnet, using the first winding part 11 of the first assembly member 10 as a winding framework;

S20: winding a shield coil 70 of the superconducting magnet, using the second winding part 21 of the second assembly member 20 as a winding framework;

S30: laying a reinforcing core material, such that the reinforcing core material is ultimately located in the infusion cavity 40, wherein the reinforcing core material is a glass fiber material for example, the shape of which may be set as required, e.g. being strip-like or sheet-like;

S40: assembling the first assembly member 10, the second assembly member 20 and the third assembly member 30 in the height direction H, to form the infusion cavity 40;

S50: infusing an infusion material into the infusion cavity 40 and curing the infusion material; during infusion, the infusion material will impregnate gaps in the main coil half-body and the shield coil; after curing, a rod part 103 formed by curing of the infusion material is formed in each extension zone 44 (see FIG. 4), and a main coil infusion half-body 102 formed by curing of the infusion material is formed in the main coil accommodating zone 41 (see FIG. 4), wherein the infusion material is a resin for example, and the resin is an epoxy resin for example;

S60: removing the processing tool, to form a superconducting magnet half-body 101 as shown in FIG. 4, the superconducting magnet half-body 101 having the same shape as the infusion cavity 40;

S70: connecting two superconducting magnet half-bodies 101 axially to form a superconducting magnet 100 as shown in FIG. 5; specifically, the main coil infusion half-bodies 102 of the two superconducting magnet half-bodies 101 are connected, and the free ends of the rod parts 103 of the two superconducting magnet half-bodies 101 are connected, for example by means of an adhesive or bolts.

Figure 6:
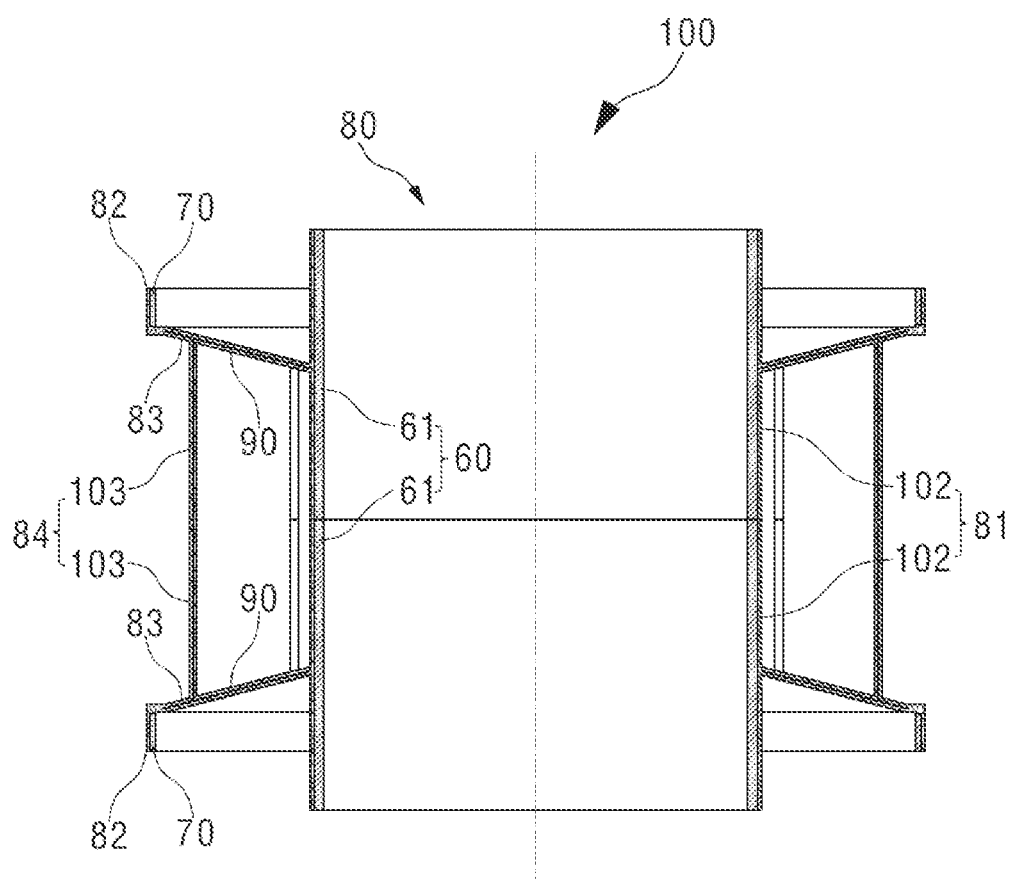
FIG. 6 is a sectional view of the example superconducting magnet shown in FIG. 5.

FIG. 6 is a sectional view of the superconducting magnet shown in FIG. 5. As shown in FIGS. 5 and 6, the superconducting magnet 100 finally formed by processing comprises a main coil 60, two shield coils 70, and an infusion main body 80 formed by curing of a liquid. The main coil 60 comprises two main coil half-bodies 61. The two shield coils 70 are arranged at two ends in the axial direction of the main coil 60 respectively in an encircling manner.

The infusion main body 80 comprises a first molded part 81, two second molded parts 82, two connecting parts 83, and a set of reinforcing parts 84 (8 in this schematic embodiment). The first molded part 81 is formed by connecting the main coil infusion half-bodies 102 of two superconducting magnet half-bodies 101, and is joined to the main coil 60 by impregnation and curing. After the infusion material has cured, one second molded part 82 formed by curing of the infusion material is formed in the shield coil accommodating zone 42, each second molded part 82 being joined to one shield coil 70 by impregnation and curing. After the infusion material has cured, one connecting part 83 formed by curing of the infusion material is formed in the linking zone 43, each connecting part 83 connecting the first molded part 81 to one second molded part 82. Each reinforcing part 84 is formed by connecting rod parts 103 of the two superconducting magnet half-bodies 101, each reinforcing part 84 taking the form of a rod extending in the axial direction of the main coil 60 overall. The two ends of each reinforcing part 84 are connected to the two connecting parts 83 respectively. A reinforcing core material 90 is embedded in the infusion main body 80.

Using the processing tool shown in FIG. 1 to process a superconducting magnet helps to reduce the difficulty of processing of the superconducting magnet. The processing method for a superconducting magnet of an MRI system that uses the processing tool shown in FIG. 1 has simple and convenient operations, helping to reduce the difficulty of processing of the superconducting magnet, and the superconducting magnet obtained by processing has good structural stability.

Figure 7:
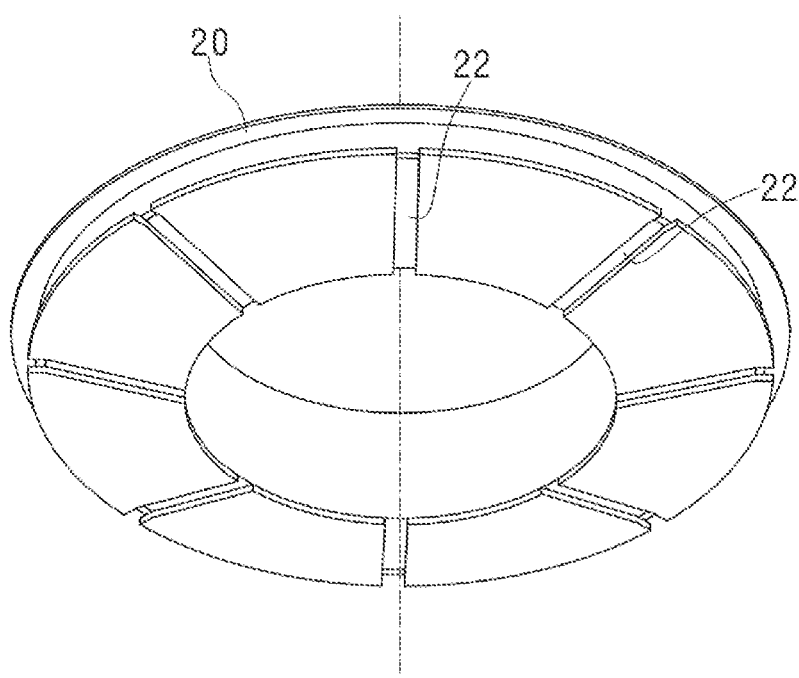
FIG. 7 is a structural schematic drawing of an example second assembly member of a processing tool for a superconducting magnet of an MRI system, in accordance with an embodiment of the present disclosure.
Figure 8:
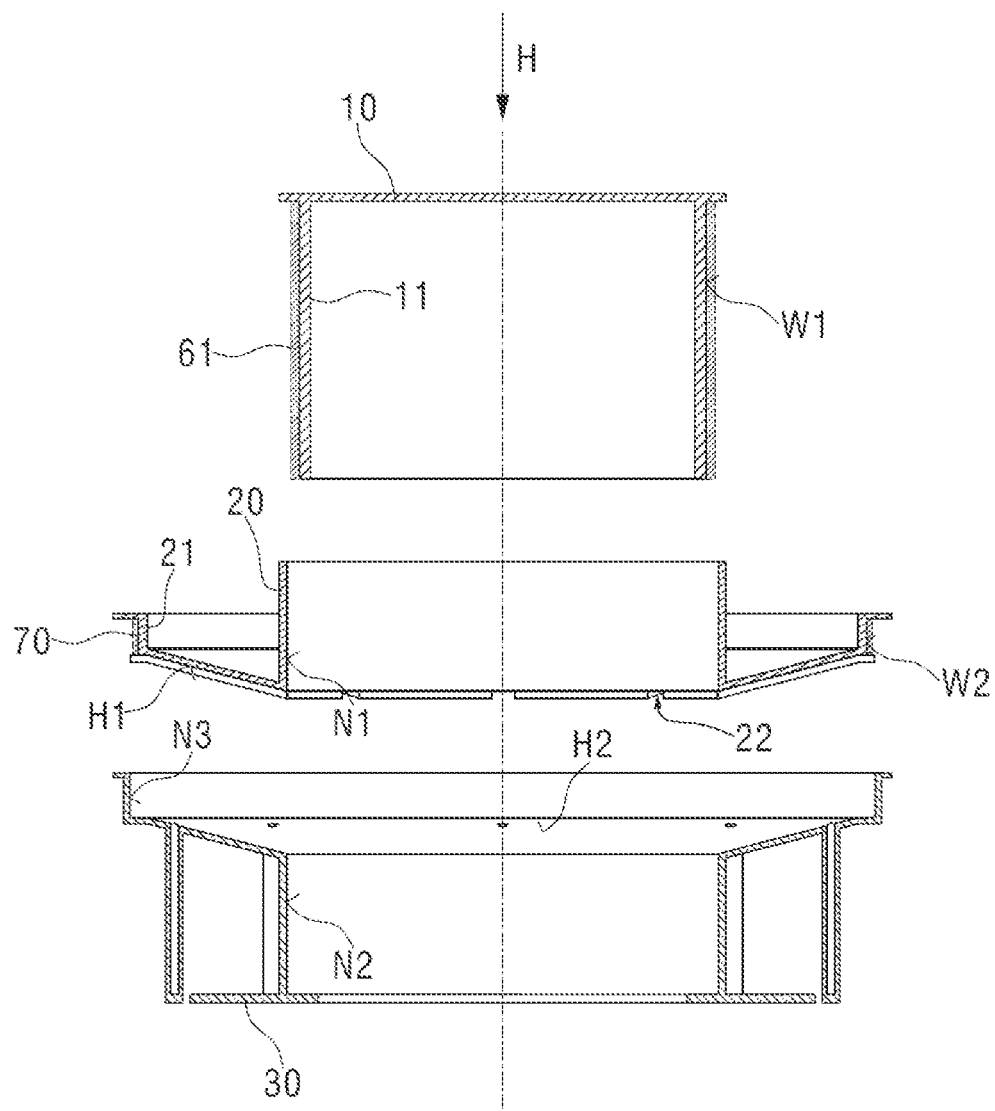
FIG. 8 is an exploded schematic drawing of an example processing tool for a superconducting magnet of an MRI system; in accordance with an embodiment of the present disclosure.

FIGS. 7 and 8 illustrate another embodiment of a processing tool for a superconducting magnet of an MRI system. Features of the processing tool of this embodiment which are identical or similar to those of the processing tool shown in FIG. 1 are not described again here; the difference lies in the linking zones 43. The linking zone 43 in this embodiment comprises multiple separate linking subzones. To achieve this, as shown in FIG. 7, the second assembly member 20 is formed with multiple grooves 22 (only two of which are labelled schematically in FIG. 7), each groove 22 corresponding to one linking subzone. Each linking subzone takes the form of a strip extending along a straight line. In this embodiment, each linking subzone takes the form of a strip extending along a generatrix of a conical frustum, wherein an axis of the conical frustum overlaps the axis of the main coil accommodating zone 41, but this is provided by way of example and not limitation. One end of each linking subzone is connected to the main coil accommodating zone 41, and the other end of each linking subzone is connected to the shield coil accommodating zone 42. Multiple linking subzones are distributed uniformly in the circumferential direction of the main coil accommodating zone 41.

Figure 9:
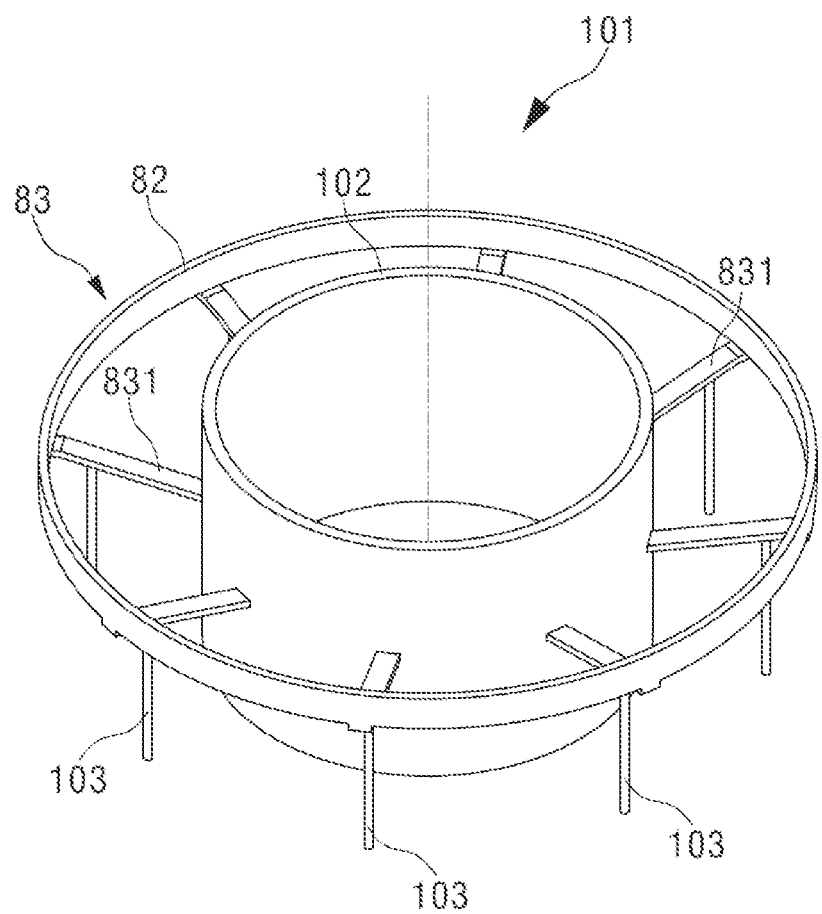
FIG. 9 is a structural schematic drawing of an example superconducting magnet half-body formed by processing with the processing tool shown in FIG. 8, in accordance with an embodiment of the present disclosure.
Figure 10:
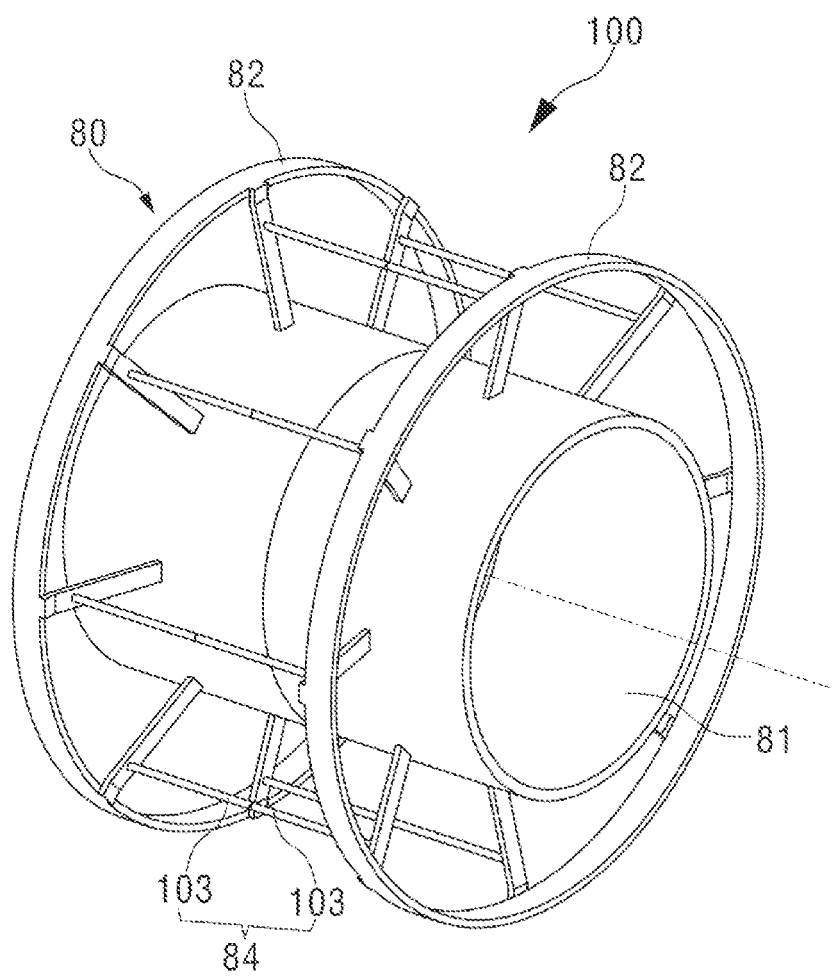
FIG. 10 is a structural schematic drawing of an example superconducting magnet formed from the superconducting magnet half-body shown in FIG. 9, in accordance with an embodiment of the present disclosure.
Figure 11:
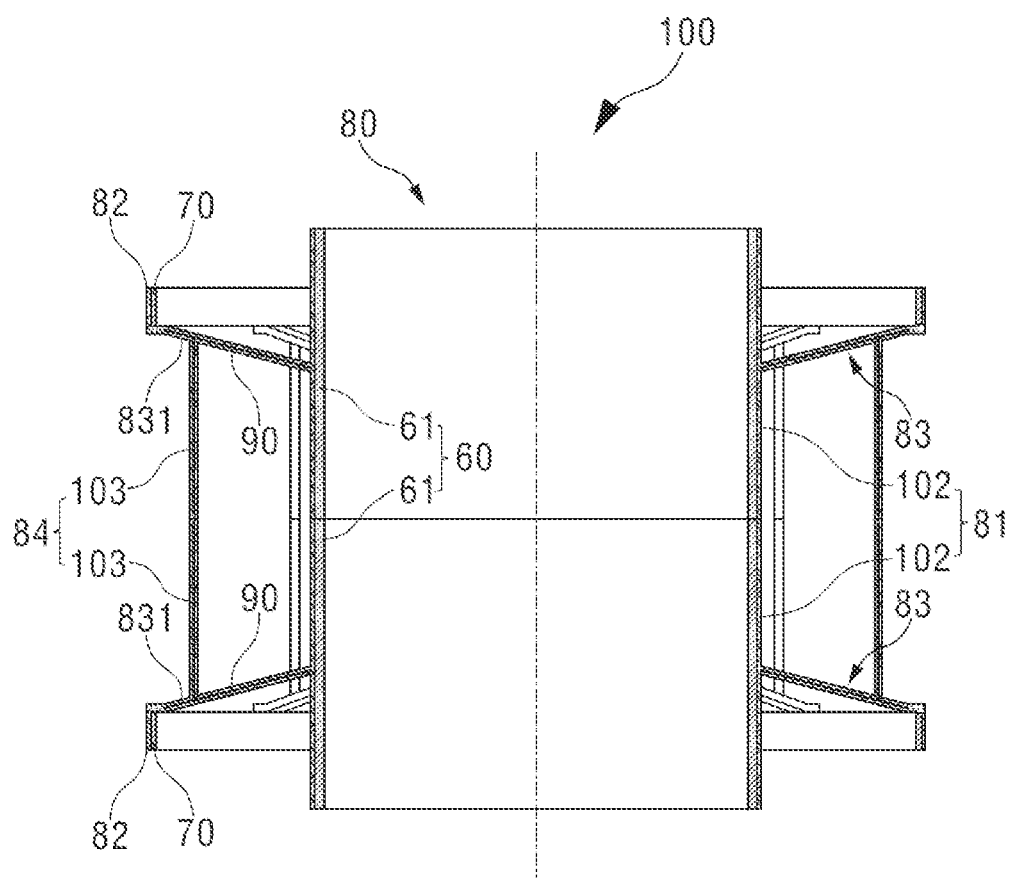
FIG. 11 is a sectional view of the example superconducting magnet shown in FIG. 10.

A processing method for a superconducting magnet that uses this processing tool is for example the same as the aforementioned processing method for a superconducting magnet that uses the processing tool shown in FIG. 1, so is not described again here. FIG. 9 is a structural schematic drawing of a superconducting magnet half-body formed by processing with the processing tool shown in FIG. 8. This superconducting magnet half-body and the superconducting magnet half-body shown in FIG. 4 differs only in the structure of the connecting part 83. As shown in FIG. 9, the connecting part 83 comprises multiple separate connecting subparts 831 (only two of which are labelled schematically in FIG. 9), each connecting subpart 831 corresponding to one linking subzone. FIG. 10 is a structural schematic drawing of a superconducting magnet formed from the superconducting magnet half-body shown in FIG. 9. The structure of the connecting part 83 helps to reduce the cost of material and overall weight of the superconducting magnet. FIG. 11 is a sectional view of the superconducting magnet shown in FIG. 10.

Using the processing tool shown in FIG. 8 to process a superconducting magnet helps to reduce the difficulty of processing of the superconducting magnet. The processing method for a superconducting magnet of an MRI system that uses the processing tool shown in FIG. 8 has simple and convenient operations, helping to reduce the difficulty of processing of the superconducting magnet, and the superconducting magnet obtained by processing has good structural stability.

It should be understood that although the description herein is based on various embodiments, it is by no means the case that each embodiment comprises only one independent technical solution; this manner of presentation is adopted herein purely for clarity, and those skilled in the art should consider the description in its entirety. The technical solutions in the different embodiments may also be suitably combined to form other embodiments which those skilled in the art can understand.

The detailed explanations set out above are merely specific explanations of feasible embodiments of the present disclosure, and are not intended to limit the scope of protection of the present disclosure. All equivalent embodiments or changes made without departing from the artistic spirit of the present disclosure, such as feature combinations, divisions or repetitions, should be included in the scope of protection of the present disclosure.

As used herein, "schematic" means "serving as an instance, example or illustration", and no drawing or embodiment described herein as "schematic" should be interpreted as a more preferred or more advantageous technical solution.

As used herein, "first", "second", etc. do not indicate degree of importance or order, etc., merely being used to indicate a distinction between parts, to facilitate the description herein.

What is claimed is:

1. A processing tool for a superconducting magnet of a magnetic resonance imaging (MRI) system, comprising:
   a first winding part that is used as a winding framework for winding a main coil half-body of the superconducting magnet;
   a second winding part that is used as a winding framework for winding a shield coil of the superconducting magnet; and
   an infusion cavity comprising:
      a main coil accommodating zone for accommodating the main coil half-body of the superconducting magnet wound on the first winding part;
      a shield coil accommodating zone for accommodating the shield coil of the superconducting magnet wound on the second winding part; and
      a linking zone,
   wherein the main coil accommodating zone is connected to the shield coil accommodating zone via the linking zone.

2. The processing tool as claimed in claim 1, wherein:
   the main coil accommodating zone is circularly tubular,
   the shield coil accommodating zone is circularly annular, and
   the shield coil accommodating zone is coaxially arranged around the main coil accommodating zone.

3. The processing tool as claimed in claim 2, wherein the linking zone is annular, with an inner edge thereof being connected to the main coil accommodating zone, and an outer edge thereof being connected to the shield coil accommodating zone.

4. The processing tool as claimed in claim 3, wherein the linking zone takes the form of an annular plate extending along a side face of a conical frustum, with an axis of the conical frustum overlapping an axis of the main coil accommodating zone.

5. The processing tool as claimed in claim 1, wherein:
   the linking zone comprises multiple separate linking subzones, each linking subzone taking the form of a strip extending along a straight line,
   one end of each respective linking subzone is connected to the main coil accommodating zone, and the other end of each respective linking subzone is connected to the shield coil accommodating zone, and
   the multiple linking subzones are distributed uniformly in a circumferential direction of the main coil accommodating zone.

6. The processing tool as claimed in claim 5, wherein each respective linking subzone takes the form of a strip extending along a generatrix of a conical frustum, with an axis of the conical frustum overlapping an axis of the main coil accommodating zone.

7. The processing tool as claimed in claim 1, wherein:
a height direction of the processing tool is parallel to an axial direction of the superconducting magnet formed via processing with the processing tool, and
the infusion cavity further comprises multiple extension zones, each respective extension zone taking the form of a rod extending in the height direction, with one end of each respective one of the multiple extension zones being connected to the linking zone, and the other end of each respective one of the multiple extension zones being closed.

8. The processing tool as claimed in claim 1, wherein a height direction of the processing tool is parallel to an axial direction of the superconducting magnet formed by processing via the processing tool, and further comprising:
a first assembly member provided with the first winding part, the first winding part having a first outer cylindrical face for winding the main coil half-body of the superconducting magnet, with an axis of the first outer cylindrical face being parallel to the height direction;
a second assembly member provided with the second winding part, the second winding part having a second outer cylindrical face for winding the shield coil of the superconducting magnet, the second outer cylindrical face being coaxially arranged around the first outer cylindrical face, and
wherein the first assembly member and the second assembly member are separated in the height direction.

9. The processing tool of claim 8, wherein the second assembly member further comprises:
a first inner cylindrical face arranged coaxially with the first outer cylindrical face and located between the first outer cylindrical face and the second outer cylindrical face; and
a first annular connecting face, with an outer edge connected to the second outer cylindrical face, and an inner edge connected to the first inner cylindrical face, and further comprising:
a third assembly member, comprising:
a second inner cylindrical face having the same diameter as the first inner cylindrical face and being coaxially arranged at one side in the axial direction of the first inner cylindrical face,
wherein the first outer cylindrical face, the first inner cylindrical face, and the second inner cylindrical face enclose the main coil accommodating zone;
a third inner cylindrical face coaxially arranged around the second outer cylindrical face,
wherein the second outer cylindrical face and the third inner cylindrical face enclose the shield coil accommodating zone, and
a second annular connecting face, an outer edge of the second annular connecting face being connected to the third inner cylindrical face, and an inner edge being connected to the second inner cylindrical face, the second annular connecting face and the first annular connecting face being arranged opposite to one another in the height direction to enclose the linking zone,
wherein the first assembly member, the second assembly member, and the third assembly member are separated in the height direction.

10. A processing method for using a processing tool for a superconducting magnet of a magnetic resonance imaging (MRI) system, the processing method comprising:
winding a main coil half-body of the superconducting magnet using a first winding part of the processing tool as a winding framework;
winding a shield coil of the superconducting magnet using a second winding part of the processing tool as a winding framework;
infusing an infusion material into an infusion cavity of the processing tool;
curing the infusion material; and
removing the processing tool from the main coil half-body of the superconducting magnet, the shield coil of the superconducting magnet, and the infusion material,
wherein the infusion cavity of the processing tool comprises (i) a main coil accommodating zone for accommodating the main coil half-body of the superconducting magnet wound on the first winding part, (ii) a shield coil accommodating zone for accommodating the shield coil of the superconducting magnet wound on the second winding part, and (iii) a linking zone, and
wherein the main coil accommodating zone is connected to the shield coil accommodating zone via the linking zone.

11. The processing method as claimed in claim 10, wherein the processing tool comprises the first winding part, the second winding part, the main coil accommodating zone, the shield coil accommodating zone, and the linking zone, and
wherein the removing the processing tool from the main coil half-body of the superconducting magnet, the shield coil of the superconducting magnet, and the infusion material forms a superconducting magnet half-body, and further comprising:
connecting two respective superconducting magnet half-bodies to form the superconducting magnet.

12. The processing method as claimed in claim 11, wherein:
a height direction of the processing tool is parallel to an axial direction of the superconducting magnet formed by processing via the processing tool,
the infusion cavity further comprises multiple extension zones, each respective one of the multiple extension zones taking the form of a rod extending in the height direction, one end of each respective one of the multiple extension zones being connected to the linking zone, and the other end of each respective one of the multiple extension zones being closed,
after the infusion material is infused into the infusion cavity and cured, a rod part formed by curing of the infusion material is formed in each respective one of the multiple extension zones,
a main coil infusion half-body formed by curing of the infusion material is formed in the main coil accommodating zone, and
the connecting of the two superconducting magnet half-bodies to form the superconducting magnet comprises:
connecting the main coil infusion half-bodies of the two superconducting magnet half-bodies, and
connecting free ends of the rod parts of the two superconducting magnet half-bodies.

13. The processing method as claimed in claim 10, further comprising:

laying a reinforcing core material prior to infusing the infusion material into the infusion cavity such that the reinforcing core material is located in the infusion cavity.

14. The processing method as claimed in claim 13, wherein the infusion material is a resin, and wherein the reinforcing core material is a glass fiber material.

15. A superconducting magnet for a magnetic resonance imaging (MRI) system, comprising:

a main coil;

two shield coils, each respectively arranged at two ends in an axial direction of the main coil in an encircling manner; and an infusion main body formed by curing of a liquid in an infusion cavity, the infusion main body comprising:

a first molded part joined to the main coil by impregnation and curing;

two second molded parts, each respective one of the two second molded parts being joined to a respective one of the two shield coils by impregnation and curing; and two connecting parts, each respective one of the two connecting parts connecting the first molded part to a respective one of the second molded parts, wherein the infusion cavity comprises (i) a main coil accommodating zone for accommodating the main coil half-body of the superconducting magnet wound on the first winding part, (ii) a shield coil accommodating zone for accommodating the shield coil of the superconducting magnet wound on the second winding part, and (iii) a linking zone, and wherein the main coil accommodating zone is connected to the shield coil accommodating zone via the linking zone.

16. The superconducting magnetic of claim 15, wherein the infusion main body further comprises:

a set of reinforcing parts, each respective reinforcing part in the set of reinforcing parts taking the form of a rod extending in an axial direction of the main coil, and wherein an end of each respective reinforcing part in the set of reinforcing parts is respectively connected to a respective one of the two connecting parts.

17. The superconducting magnet as claimed in claim 15, wherein a reinforcing core material is embedded in the infusion main body.

* * * * *